United States Patent
Chen et al.

(10) Patent No.: US 9,780,209 B1
(45) Date of Patent: Oct. 3, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chih-Fen Chen, Taoyuan (TW); Bang-Yu Huang, Hsinchu County (TW); Chui-Ya Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/208,830

(22) Filed: Jul. 13, 2016

(51) Int. Cl.
*H01L 29/78* (2006.01)
*H01L 29/08* (2006.01)
*H01L 29/66* (2006.01)
*H01L 23/528* (2006.01)

(52) U.S. Cl.
CPC ...... *H01L 29/7834* (2013.01); *H01L 23/5283* (2013.01); *H01L 29/0847* (2013.01); *H01L 29/66492* (2013.01)

(58) Field of Classification Search
CPC ........... H01L 29/7834; H01L 29/66492; H01L 29/0847; H01L 23/5283
See application file for complete search history.

(56) References Cited

U.S. PATENT DOCUMENTS

| | | | |
|---|---|---|---|
| 2005/0212043 A1* | 9/2005 | Komatsubara | H01L 29/7834 257/344 |
| 2008/0230845 A1* | 9/2008 | Okonogi | H01L 21/26506 257/382 |
| 2013/0320434 A1* | 12/2013 | Shin | H01L 29/7827 257/329 |
| 2014/0035000 A1* | 2/2014 | Ontalus | H01L 29/665 257/192 |
| 2014/0077288 A1* | 3/2014 | Yamamoto | H01L 29/665 257/329 |
| 2015/0235897 A1* | 8/2015 | Fu et al. | H01L 21/76879 438/299 |
| 2015/0262822 A1* | 9/2015 | Hung | H01L 21/28088 257/412 |
| 2015/0263168 A1* | 9/2015 | Hsiao | H01L 29/66492 257/402 |
| 2015/0372102 A1* | 12/2015 | Usami | H01L 29/41775 257/327 |
| 2016/0099243 A1* | 4/2016 | Azmat | H01L 27/088 257/368 |
| 2016/0260806 A1* | 9/2016 | Leobandung | H01L 29/267 |

* cited by examiner

*Primary Examiner* — Nathan W Ha
(74) *Attorney, Agent, or Firm* — McClure, Qualey & Rodack, LLP

(57) ABSTRACT

A semiconductor device includes a substrate, a gate stack, at least one epitaxy structure, a dielectric material, and a contact. The gate stack is present on the substrate. The gate spacer is present on a sidewall of the gate stack. The epitaxy structure is partially present in the substrate. The dielectric material is present on the substrate and between the epitaxy structure and the gate spacer. The contact is present on the epitaxy structure, the dielectric material, and the gate spacer.

20 Claims, 6 Drawing Sheets

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. When a semiconductor device, such as a metal-oxide-semiconductor field-effect transistor (MOSFET), is scaled down through various technology nodes, high k dielectric material and metal are adopted to form a gate stack. In addition, to further enhance the performance of MOSFET devices, stress may be introduced in the channel region of a MOSFET device to improve carrier mobility. For example, the strained structures utilizing epitaxy structure may be used to enhance carrier mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
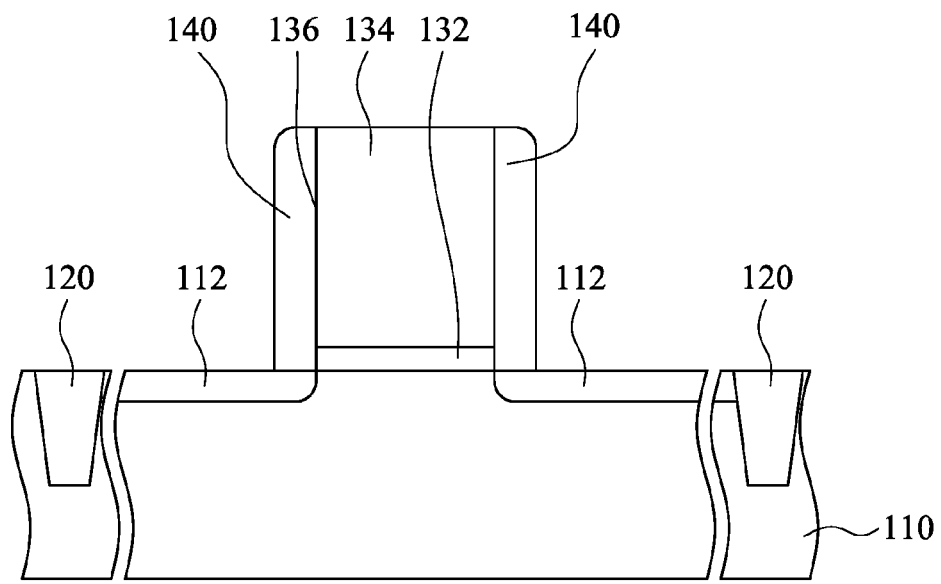
FIGS. 1 to 7 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 to 7 are cross-sectional views of a method for manufacturing a semiconductor device at various stages in accordance with some embodiments of the present disclosure. Reference is made to FIG. 1. A substrate 110 is provided. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The substrate 110 may include various doped regions such as n-well and p-wells formed by a proper technique, such as ion implantation. The substrate 110 also includes various isolation features, such as shallow trench isolation (STI) 120, formed in the substrate 110 to separate various devices. The formation of the STI 120 may include etching a trench in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the STI 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

In FIG. 1, a gate stack 130 including a gate dielectric 132 and a gate electrode 134 is formed on the substrate 110. In some embodiments, in order to form the gate stack 130, a gate dielectric layer is formed on the substrate 110, followed by a gate electrode layer. The gate dielectric layer and the gate electrode layer are then patterned, forming the gate dielectric 132 and the gate electrode 134. As is known in the art, hard masks 105 may be formed on the gate stack 130 for process reasons, wherein the hard masks may include silicon nitride.

The gate dielectric 132 may include various known materials such as a silicon oxide, a silicon nitride, or a silicon oxynitride. Alternatively, the gate dielectric 132 may have high dielectric constant (HK) values. In some embodiments, the gate dielectric 132 includes $HfO_2$. Alternatively, the gate dielectric 132 may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The gate dielectric 132 can be formed by a suitable process such as atomic layer deposition (ALD). Other methods to form the gate dielectric 132 include metal organic chemical vapor deposition (MOCVD), physical vapor deposition (PVD), UV-Ozone Oxidation, or molecular beam epitaxy (MBE).

The gate electrode 134 can be made of polycrystalline-silicon (poly-Si), poly-crystalline silicon-germanium (poly-SiGe), or other suitable materials. For example, in some embodiments, the gate electrode 134 includes polysilicon deposited undoped by low-pressure chemical vapor deposition (LPCVD). The polysilicon may also be deposited, for example, by furnace deposition of an in-situ doped polysilicon. Alternatively, the gate electrode 134 may include other suitable materials. Further, the gate electrode 134 may be doped poly-silicon with uniform or non-uniform doping.

A plurality of lightly doped source/drain (LDD) regions 112 are formed in the substrate 110. In some embodiments, the LDD regions 112 are formed in the substrate 110, interposed by the gate stack 130. The LDD regions 112 are aligned with sidewalls 136 of the gate stack 130. In other words, the gate stack 130 acts as the implantation mask so that the edges of the LDD regions 112 are substantially aligned with the edges of the gate stack 130. The LDD regions 112 are formed by an ion implantation process, diffusion process, other suitable process, or combinations thereof. In some embodiments, the LDD regions 112 for an NFET device are doped with an n-type dopant, such as phosphorus or arsenic. In some other embodiments, the LDD regions 112 for a PFET device are doped with a p-type dopant, such as boron or $BF_2$.

A plurality of gate spacers 140 are respectively formed on sidewalls 136 of the gate stack 130. The gate spacer 140 may include a seal spacer and a main spacer (not shown). The gate spacers 140 include one or more dielectric materials, such as silicon oxide, silicon nitride, silicon oxynitride, or combinations thereof. The seal spacers are formed on sidewalls 136 of the gate stack 130 and the main spacers are formed on the seal spacers. In some embodiments, the gate spacers 140 include additional layers. For example, an additional layer (not shown) is formed on the seal spacer and then the main spacer is formed on the additional layer. In some embodiments, the seal spacer includes silicon nitride, the additional layer includes silicon oxide, and the main spacer includes silicon nitride. The seal spacers, the main spacers, and the additional layer are formed by deposition, photolithography, and etch processes in a known manner. The gate spacers 140 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 140 may include blanket forming spacer layers, and then performing etching steps to remove the horizontal portions of the spacer layers. The remaining vertical portions of the gate spacer layers form the gate spacers 140. The gate spacers 140 may have a thickness ranging from about 4 to about 6 nm, in accordance with some embodiments.

Figure 2:
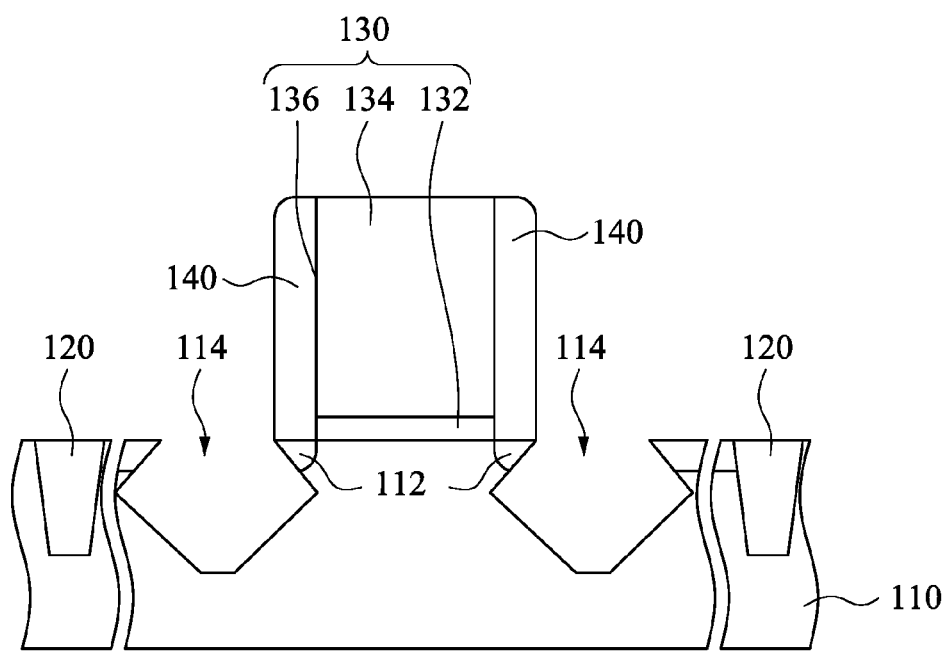

Reference is made to FIG. 2. Two recesses 114 are respectively formed at opposite sides of the gate stack 130 by etching the substrate 110. The gate stack 130 and the gate spacers 140 act as an etching mask in the formation of the recesses 114. The etching process includes a dry etching process, a wet etching process, or combinations thereof. In FIG. 2, the etching process utilizes a combination dry and wet etching. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. For the dry etching process, the etching gas may be selected from, for example, HBr, $Cl_2$, $Cl_4$, $SF_6$, $NF_3$, $CH_2F_2$, $N_2$, $O_2$, Ar, He, and combinations thereof. The etching gas may be a single-etching step or may include a plurality of etching steps. In the recessing step, the plasma of the etching gas is generated. In some embodiments, the wet etching process first implements a 100 parts water to 1 part HF concentration of an HF solution at room temperature, and then implements a $NH_4OH$ solution at a temperature of about 20° C. to about 60° C. In some other embodiments, the wet etching process first implements a 100:1 concentration of an HF solution at room temperature, and then implements a TMAH solution at a temperature of about 20° C. to about 60° C.

One skilled in the art will realize that the dimensions of the recesses 114 recited throughout the description are merely examples, and will change if different formation technologies are used. In FIG. 2, the recesses 114 have diamond shapes in the cross-sectional view. The cross-sectional view shape of the recesses 114 are determined by various factors such as the crystal orientation of the substrate 110, the type of etchant, the etching conditions, and the like. In some embodiments, after the etching process, a pre-cleaning process may be performed to clean the recesses 114 with a hydrofluoric acid (HF) solution or other suitable solution.

In FIG. 2, portions of the LDD regions 112 are removed during the formation of the recesses 114. Hence, after the formation of the recesses 114, another portions of the LDD regions 112 are respectively disposed between the gate stack 130 and the recesses 114 and beneath the gate spacers 140. In other words, one of the LDD regions 112 is disposed beneath the gate spacers 140 and adjacent to one of the recesses 114.

Figure 3:
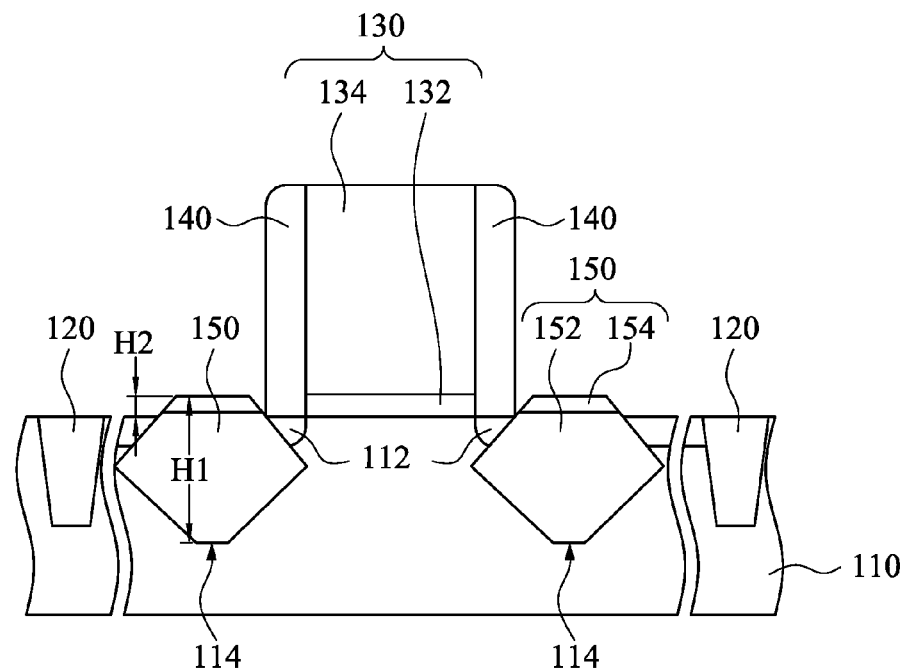

Reference is made to FIG. 3. A semiconductor material is deposited in the recesses 114 to form epitaxy structures 150 which are referred to as source and drain features. The epitaxy structures 150 may alternatively be referred to as raised source and drain regions. For example, the semiconductor material, such as silicon germanium (SiGe), is epitaxially grown in the recesses 114 to respectively form the epitaxy structures 150. In some embodiments, the epitaxy may be a selective epitaxial growth (SEG) process, in which the semiconductor material is grown in the recesses 114, and not on dielectric materials. In some other embodiments, the epitaxy may include CVD deposition techniques (e.g., vapor-phase epitaxy (VPE) and/or ultra-high vacuum CVD (UHV-CVD)), molecular beam epitaxy, other suitable epitaxy processes, or combinations thereof. The epitaxy process may use gaseous and/or liquid precursors, which may interact with the composition of the substrate 110. The epitaxy structures 150 may have a lattice constant greater than the lattice constant of the substrate 110. The precursor for growing SiGe may include germane ($GeH_4$, which provides germanium), dichlorosilane (DCS, which provides silicon), and the like. Desired p-type or n-type impurities may be, or may not be, doped while the epitaxial growth proceeds. The doping may be achieved by an ion implantation process, plasma immersion ion implantation (PHI) process, gas and/ or solid source diffusion process, other suitable process, or combinations thereof. The epitaxy structures 150 may further be exposed to annealing processes, such as a rapid thermal annealing process. After being annealed, SiGe will try to restore its lattice constant, thus introducing compressive stresses to the channel regions of the resulting PMOS devices. Throughout the description, the SiGe epitaxy regions are alternatively referred to as SiGe stressors. In alternative embodiments, other semiconductor materials such as silicon carbon (SiC) may be grown to generate tensile stress in the channels of the resulting semiconductor device, which may be an n-type semiconductor device.

In FIG. 3, one of the epitaxy structures 150 includes a main body 152 and a cap layer 154. The main body 152 is present in the recess 114, and the cap layer 154 is present on the main body 152. The main body 152 may be made of silicon or silicon germanium. The cap layer 154 may be a silicide layer formed by a self-aligned silicide (salicide) process. Silicides, which are compounds formed from a metal and silicon, are used for contacts in semiconductor devices. Silicide contacts are thermally stable, have lower resistivity than polysilicon, and are good ohmic contacts. Silicide contacts are also reliable, since the silicidation reaction eliminates many defects at an interface between a contact and a device feature. A technique used in the semiconductor manufacturing industry is self-aligned silicide ("salicide") processing. Silicide processing can be used in the fabrication of high-speed complementary metal oxide semiconductor (CMOS) devices. The silicide process converts the surface portions of the epitaxy structures 150 into the silicide contacts. Silicide processing involves the deposition of a metal that undergoes a silicidation reaction with silicon (Si). In order to form silicide contacts on the epitaxy structures 150, metal material is blanket deposited on the epitaxy structures 150. After heating the wafer to a temperature at which the metal reacts with the silicon of the epitaxy structures 150 to form contacts, unreacted metal is removed. Silicide contacts remain over the epitaxy structures 150, while unreacted metal is removed from other areas. The silicide layer may include a material selected from titanium silicide, cobalt silicide, nickel silicide, platinum silicide, erbium silicide, and palladium silicide.

During the formation of the epitaxy structure 150, a height H1 of the epitaxy structure 150 is tuned. For example, the height H1 epitaxy structure 150 can be tuned during the epitaxial growth process. In some embodiments, the height H1 epitaxy structure 150 is greater than about 100 nm. Furthermore, a portion of the epitaxy structure 150 protrudes from the substrate 110. For example, the cap layer 154 and a portion of the main body 152 protrude from the substrate 110. The portion of the epitaxy structure 150 protrude from the substrate 110 has a height H2, and the height H2 is about 10% to about 20% of the height H1. In some embodiments, the height H2 is about 13 nm, and the present disclosure is not limited in this respect.

Figure 4:
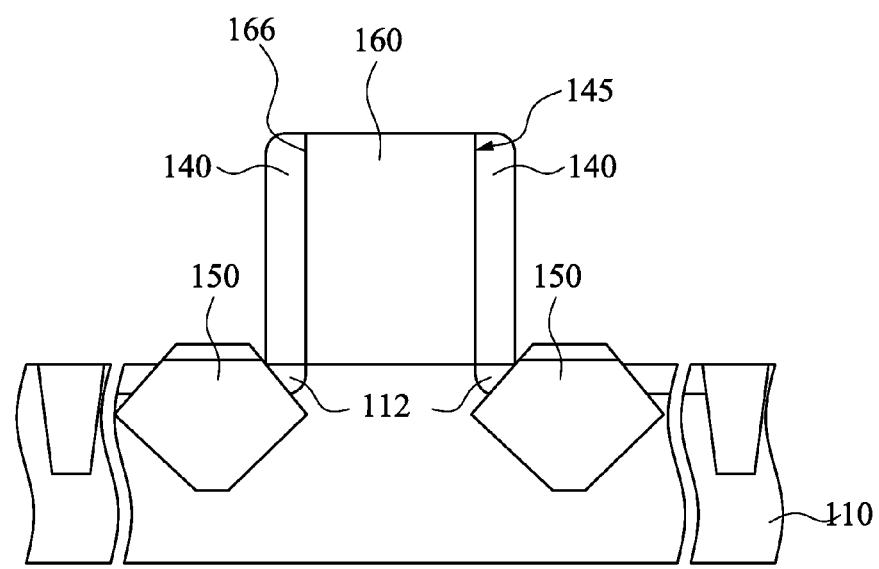

Reference is made to FIG. 4. In some embodiments, a replacement gate (RPG) process scheme is employed. In a RPG process scheme, a dummy polysilicon gate is formed first and is replaced later by a metal gate after high thermal budget processes are performed. In some embodiments, the gate electrode 134 (see FIG. 1) is removed to form an opening 145 with the gate spacers 140 as its sidewall. In some other embodiments, the gate dielectric 132 (see FIG. 1) is removed as well. Alternatively, in some embodiments, the gate electrode 134 is removed while the gate dielectric 132 retains. The gate electrode 134 (and the gate dielectric 132) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Then, a gate stack 160 made of metal is formed in the opening 145. In other words, the gate spacers 140 are disposed on opposite sidewalls 166 of the gate stack 160. The gate stack 160 formed may also include gate dielectric layer(s), capping layer(s), fill layer(s), and/or other suitable layers that are desirable in a metal gate stack. A work function metal layer included in the gate stack 160 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In some embodiments, the gate stack 160 formed is a p-type metal gate including a p-type work function layer. In some embodiments, the capping layer included in the gate stack 160 may include refractory metals and their nitrides (e.g. TiN, TaN, $W_2N$, TiSiN, TaSiN). The cap layer of the gate stack 160 may be deposited by PVD, CVD, Metal-organic chemical vapor deposition (MOCVD) and ALD. In some embodiments, the fill layer included in the gate stack 160 may includes tungsten (W). The metal layer may be deposited by ALD, PVD, CVD, or other suitable process.

Figure 5:
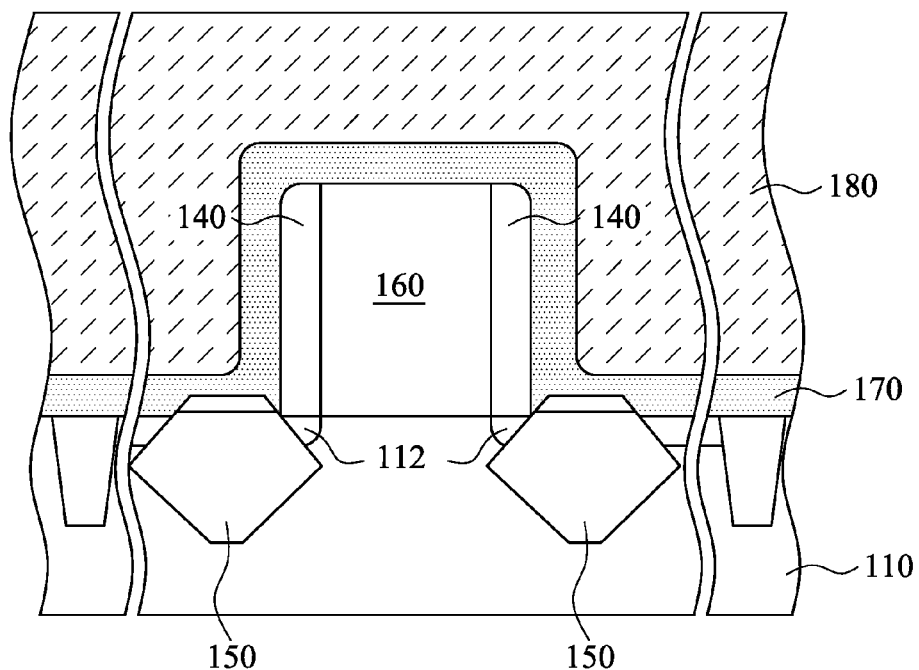

Reference is made to FIG. 5. At least one dielectric layer is formed to cover the structure of FIG. 4. For example, a stressed layer 170 is formed to cover the structure of FIG. 4. The stressed layer 170 may be referred to as a contact etch stop layer (CESL). In some other embodiments, the stressed layer 170 can be a stressed layer or layers without performing an etch stop function. The stressed layer 170 may also be a composite layer comprising a CESL and other layers. In some embodiments, the stressed layer 170 has a thickness of between about 5 nm and about 100 nm, and has an inherent stress of between about 0 Pa and about 2 GPa. In some embodiments, the stressed layer 170 has a tensile stress and is formed of $Si_3N_4$. In some other embodiments, the stressed layer 170 includes materials such as oxynitrides, and/or other materials whose formation causes a hydrogen-containing by-product to be generated. In yet some other embodiments, the stressed layer 170 may have a composite structure including a plurality of layers, such as a silicon nitride layer overlying a silicon oxide layer. The stressed layer 170 can be formed using plasma enhanced CVD (PECVD), however, other commonly used methods such as low pressure CVD (LPCVD), atomic layer deposition (ALD), and the like can also be used.

Another dielectric layer, an interlayer dielectric (ILD) 180, is then formed on the stressed layer 170. The interlayer dielectric 180 may be formed by chemical vapor deposition (CVD), high-density plasma CVD, spin-on, sputtering, or other suitable methods. In some embodiments, the interlayer dielectric 180 includes silicon oxide. In some other embodiments, the interlayer dielectric 180 may include silicon oxy-nitride, silicon nitride, or a low-k material.

Figure 6:
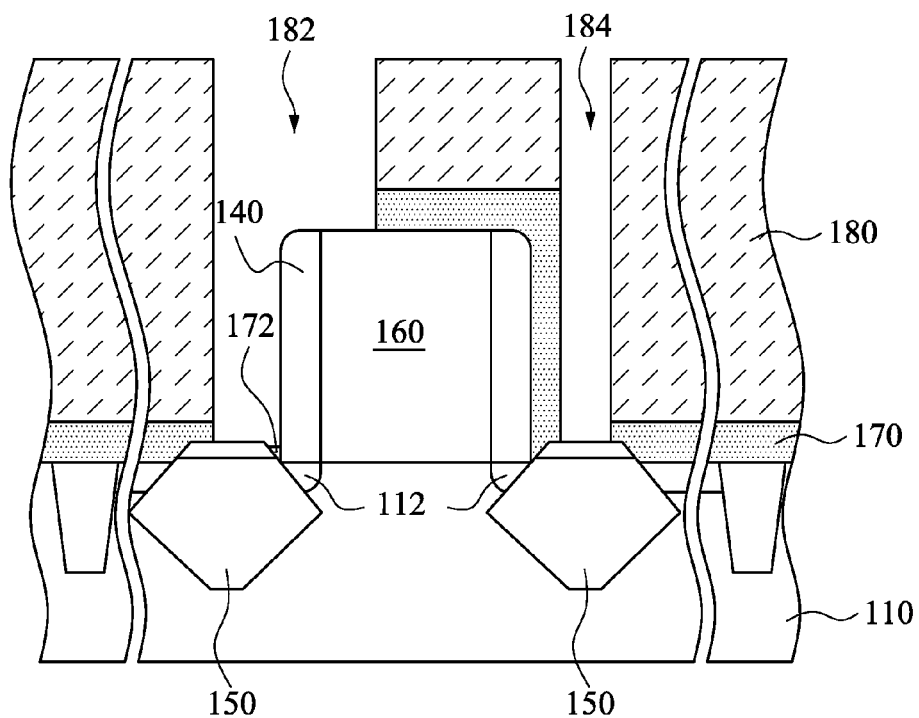

Reference is made to FIG. 6. The interlayer dielectric 180 and the stressed layer 170 are etched to form a plurality of openings 182 and 184 by various methods, including a dry etch, a wet etch, or a combination of dry etch and wet etch. The opening 182 extends substantially vertically through the interlayer dielectric 180 and the stressed layer 170 and exposes one of the epitaxy structures 150, one of the gate spacers 140, and a portion of the gate stack 160, and the opening 184 extends substantially vertically through the interlayer dielectric 180 and the stressed layer 170 and exposes another of the epitaxy structures 150. Furthermore, since the height H2 (see FIG. 3) of the epitaxy structures 150 is tuned during the epitaxial growth process, a portion of the stressed layer 170 in the opening 184 remains during the etching process and referred as a dielectric material 172. That is, the dielectric material 172 and the stressed layer 170 have substantially the same material in FIG. 6. The dielectric material 172 is adjacent to the epitaxy structure 150, on the substrate 110, and between the epitaxy structure 150 and the gate stack 160 (and the gate spacer 140). The term "substantially" as used herein may be applied to modify any quantitative representation which could permissibly vary without resulting in a change in the basic function to which it is related.

Figure 7:
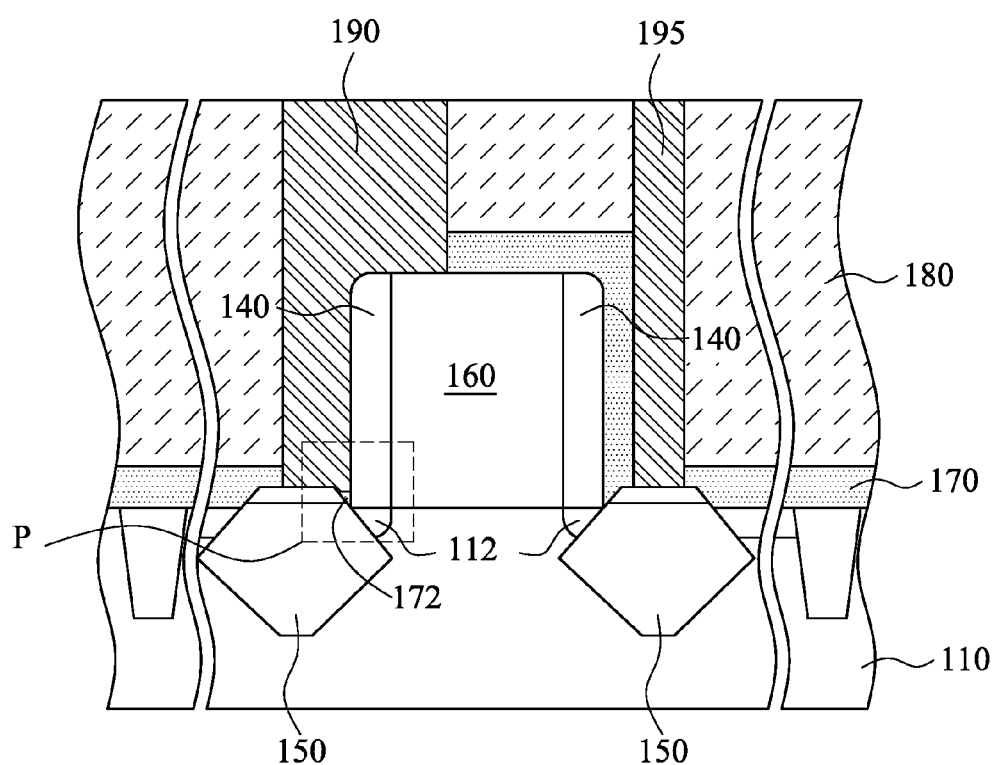
Figure 8:
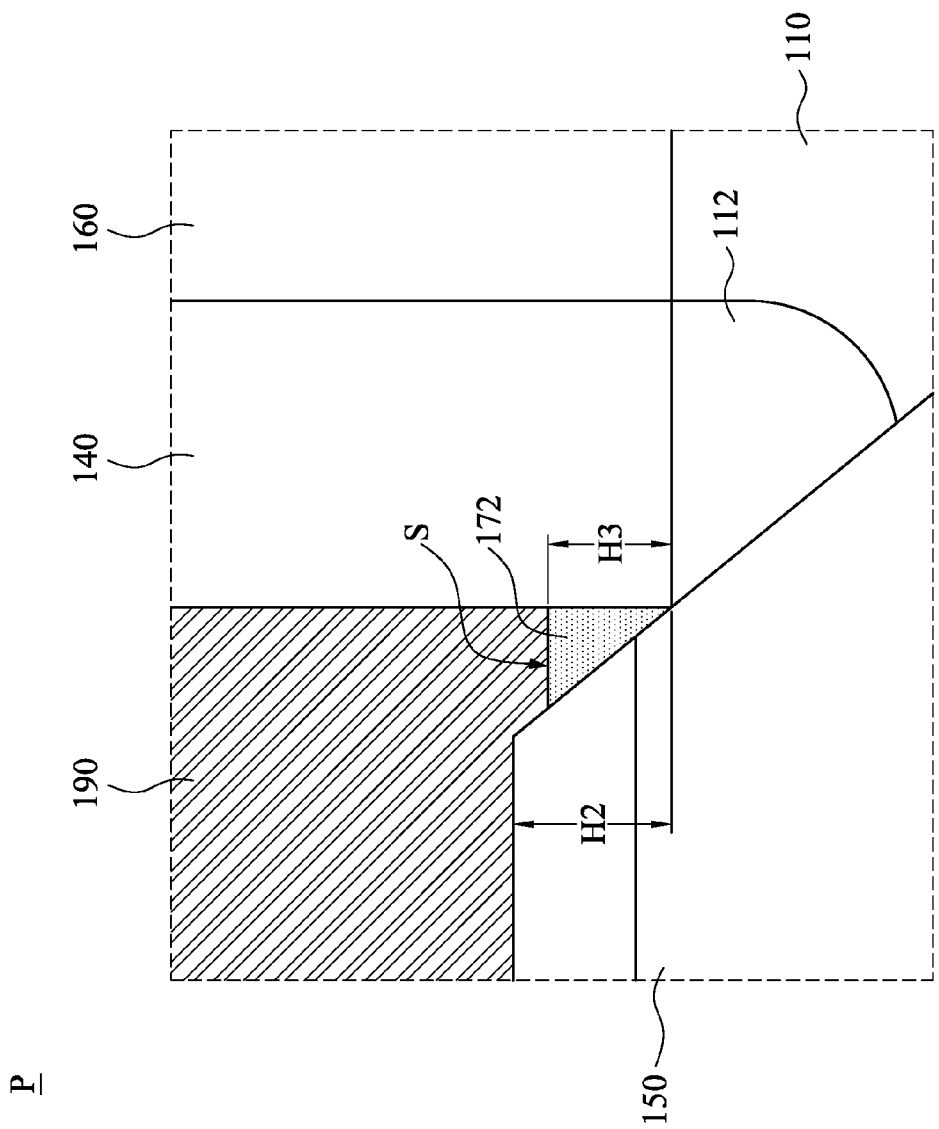
FIG. 8 is an enlarged view of area P of FIG. 7.

Reference is made to FIGS. 7 and 8, where FIG. 8 is an enlarged view of area P of FIG. 7. A contact 190 is formed in the opening 182 of FIG. 7, and a contact 195 is formed in the opening 184 of FIG. 7. That is, the dielectric layers, i.e., the stressed layer 170 and the interlayer dielectric 180, surround the contacts 190 and 195. The contact 190 is connected to one of the epitaxy structures 150 and the gate stack 160, and the contact 195 is connected to another of the epitaxy structures 150. In some embodiments, metal materials can be filled in the openings 182 and 184, and the excessive portions of the metal materials are removed by performing a CMP process to form the contacts 190 and 195. The contacts 190 and 195 can be made of tungsten, aluminum, copper, or other suitable materials.

In FIG. 8, the contact 190 is present on the epitaxy structure 150 and the dielectric material 172 and adjacent to the gate spacer 140. In other words, the contact 190 covers the dielectric material 172. In other words, the contact 190, the gate spacer 140, the substrate 110, and the epitaxy structure 150 together define a space S, and the dielectric material 172 is present in the space S. With such configuration, the contact 190 and the LDD region 112 are separated from each other via the dielectric material 172, as such, the current of the contact 190 will not leakage to the substrate 110 from the LDD region 112, and the electrical properties of the semiconductor device can be improved.

In some embodiments, the portion of the epitaxy structure 150 protruding from the substrate 110 has the height H2, and the dielectric material 172 has a height H3. The height H3 is smaller than the height H2, and the height H3 is about 3 nm to about 15 nm.

Figure 9:
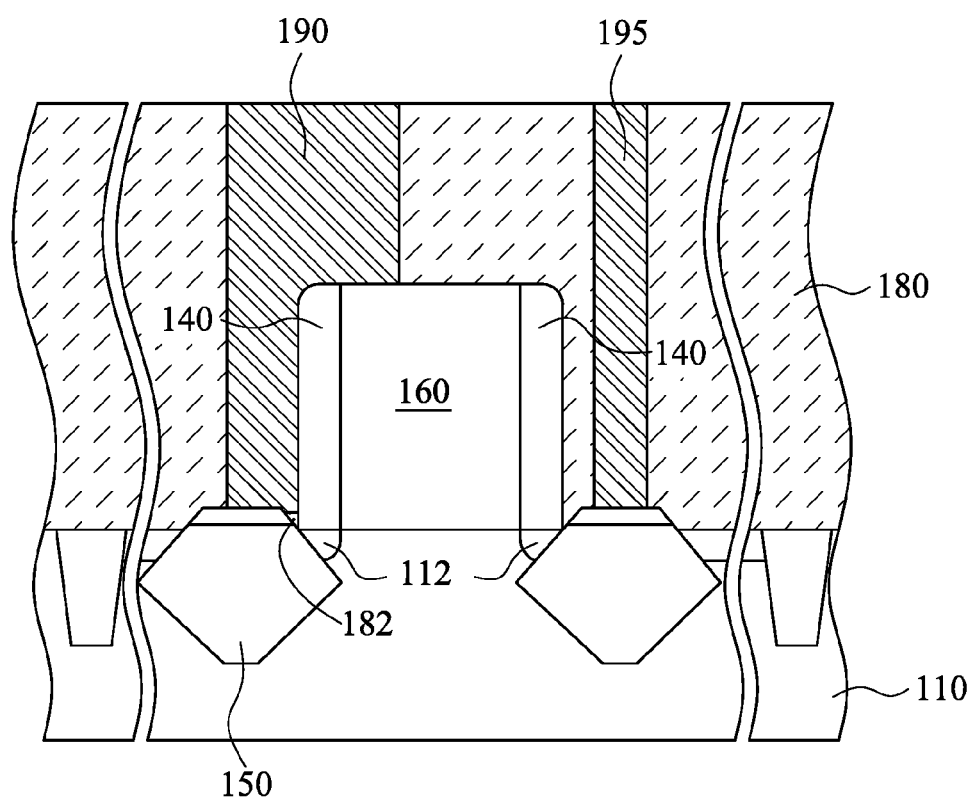
FIG. 9 is a cross-sectional view of a semiconductor device in accordance with some embodiments of the present disclosure.

FIG. 9 is a cross-sectional view of a semiconductor device in accordance with some embodiments of the present disclosure. In FIG. 9, the stressed layer 170 of FIG. 7 is omitted. That is, the dielectric material 172 and the interlayer dielectric 180 have substantially the same material. In some other embodiments, the stressed layer 170 of FIG. 7 may be thin, such that the dielectric material may be a residue of the stressed layer 170 and/or the interlayer dielectric 180. Other relevant structural details of the second embodiment are similar as the semiconductor device of FIG. 7, and, therefore, a description in this regard will not be repeated hereinafter.

According to some embodiments, a semiconductor device includes a substrate, a gate stack, at least one epitaxy structure, a dielectric material, and a contact. The gate stack is present on the substrate. The gate spacer is present on a sidewall of the gate stack. The epitaxy structure is partially present in the substrate. The dielectric material is present on the substrate and between the epitaxy structure and the gate spacer. The contact is present on the epitaxy structure, the dielectric material, and the gate spacer.

According to some embodiments, a semiconductor device includes a substrate, at least one epitaxy structure, a gate stack, a gate spacer, a contact, and a dielectric material. The epitaxy structure is partially present in the substrate. The gate stack is present on the substrate. The gate spacer is present on a sidewall of the gate stack. The contact is present on the epitaxy structure, the gate spacer, and the gate stack. The contact, the gate spacer, the substrate, and the epitaxy structure together define a space, and the contact is electrically connected to the gate stack and the epitaxy structure. The dielectric material present in the space.

According to some embodiments, a method for manufacturing a semiconductor device includes forming a gate stack on the substrate. At least one gate spacer is formed on a sidewall of the gate stack. An epitaxy structure is formed partially in the substrate. A height of the epitaxy structure is tuned. At least one dielectric layer is formed to cover at least the epitaxy structure, the gate spacer, and the gate stack. An opening is formed in the dielectric layer to expose a portion of the epitaxy structure and the gate spacer. A portion of the dielectric layer is remained between the epitaxy structure and the gate spacer. A contact is formed in the opening. The contact covers the portion of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate;
    a gate stack present on the substrate;
    at least one gate spacer present on a sidewall of the gate stack;
    at least one epitaxy structure partially present in the substrate;
    a dielectric material present on the substrate and between the epitaxy structure and the gate spacer; and
    a contact present on the epitaxy structure, the dielectric material, and the gate spacer, wherein an interface of the dielectric material and the contact is lower than a top surface of the epitaxy structure.

2. The semiconductor device of claim 1, wherein a portion of the epitaxy structure protrudes from the substrate, and a height of the portion of the epitaxy structure protruding from the substrate is about 10% to about 20% of a height of the epitaxy structure.

3. The semiconductor device of claim 1, wherein a height of the dielectric material is smaller than a height of the portion of the epitaxy structure protruding from the substrate.

4. The semiconductor device of claim 1, further comprising a lightly doped source and drain regions present in the substrate and adjacent to the epitaxy structure.

5. The semiconductor device of claim 1, further comprising a dielectric layer present on the substrate and surrounding the contact.

6. The semiconductor device of claim 5, wherein the dielectric material and the dielectric layer have substantially the same material.

7. The semiconductor device of claim 5, wherein the dielectric layer is a stressed layer.

8. The semiconductor device of claim 1, wherein the contact is further present on at least a portion of the gate stack.

9. The semiconductor device of claim 1, wherein the contact is electrically connected to the gate stack and the epitaxy structure.

10. A semiconductor device comprising:
   a substrate;
   at least one epitaxy structure partially present in the substrate;
   a gate stack present on the substrate;
   a gate spacer present on a sidewall of the gate stack;
   a contact present on the epitaxy structure, the gate spacer, and the gate stack, wherein the contact, the gate spacer, the substrate, and the epitaxy structure together define a space, and the contact is electrically connected to the gate stack and the epitaxy structure; and
   a dielectric material present in the space.

11. The semiconductor device of claim 10, wherein the dielectric material is adjacent to the epitaxy structure and the gate spacer.

12. The semiconductor device of claim 10, further comprising a dielectric layer present on the substrate, wherein the dielectric layer has at least one opening, and the contact is present in the opening of the dielectric layer.

13. The semiconductor device of claim 12, wherein the dielectric material and the dielectric layer have substantially the same material.

14. The semiconductor device of claim 10, further comprising a lightly doped source and drain regions present under the gate spacer.

15. A method for manufacturing a semiconductor device comprising:
   forming a gate stack on the substrate;
   forming at least one gate spacer on a sidewall of the gate stack;
   forming an epitaxy structure partially in the substrate;
   tuning a height of the epitaxy structure;
   forming at least one dielectric layer to cover at least the epitaxy structure, the gate spacer, and the gate stack;
   forming an opening in the dielectric layer to expose a portion of the epitaxy structure and the gate spacer, wherein a portion of the dielectric layer is remained between the epitaxy structure and the gate spacer; and
   forming a contact in the opening, wherein the contact covers the portion of the dielectric layer, and an interface of the dielectric material and the contact is lower than a top surface of the epitaxy structure.

16. The method of claim 15, further comprising forming a lightly doped source and drain regions in the substrate, beneath the gate spacer, and adjacent to the epitaxy structure.

17. The method of claim 15, wherein the opening of the dielectric layer further expose a portion of the gate stack.

18. The method of claim 15, wherein the forming the dielectric layer comprises forming an interlayer dielectric to cover at least the epitaxy structure and the gate structure.

19. The method of claim 15, wherein the forming the dielectric layer comprises forming a stressed layer to cover at least the epitaxy structure and the gate structure.

20. The method of claim 15, wherein the forming the epitaxy structure comprises:
   forming a main body; and
   forming a cap layer on the main body.

* * * * *